United States Patent [19]

Lal et al.

[11] Patent Number: 5,366,607
[45] Date of Patent: * Nov. 22, 1994

[54] SPUTTERING TARGET AND ASSEMBLY

[75] Inventors: Brij B. Lal, San Jose; Tadashi Shinohara, Fremont, both of Calif.

[73] Assignee: HMT Technology Corporation, Fremont, Calif.

[*] Notice: The portion of the term of this patent subsequent to Dec. 29, 2009 has been disclaimed.

[21] Appl. No.: 995,688

[22] Filed: Dec. 23, 1992

Related U.S. Application Data

[63] Continuation-in-part of Ser. No. 740,436, Aug. 5, 1991, Pat. No. 5,174,880, and Ser. No. 837,855, Feb. 18, 1992.

[51] Int. Cl.$^5$ ............................................. C23C 14/34
[52] U.S. Cl. ........................... 204/298.19; 204/298.17; 204/298.21; 204/298.13
[58] Field of Search ....................... 204/192.12, 192.15, 204/192.2, 298.12, 298.13, 298.17, 298.18, 298.19

[56] References Cited

U.S. PATENT DOCUMENTS

| | | | |
|---|---|---|---|
| 4,486,287 | 12/1984 | Fournier | 204/192.2 X |
| 4,626,336 | 12/1986 | Bloomquist et al. | 204/192.2 X |
| 4,933,064 | 6/1990 | Geisler et al. | 204/298.17 |
| 5,004,652 | 4/1991 | Lal et al. | 204/192.2 X |
| 5,174,880 | 12/1992 | Bourez et al. | 204/298.17 |

Primary Examiner—Nam Nguyen
Attorney, Agent, or Firm—Peter J. Dehlinger; Judy M. Mohr

[57] ABSTRACT

A target assembly for use in a magnetron sputtering apparatus having a source of a magnetic field. The apparatus includes an annular sputtering target, and inner and outer poles surrounding the target, defining inner and outer confronting walls which extend beyond the target surface, for conducting magnetic flux across the target. These confronting walls are lined with inner and outer confronting target rings. The annual target and target rings may have different compositions, for use in forming sputtered films with a gradient composition.

8 Claims, 4 Drawing Sheets

SPUTTERING TARGET AND ASSEMBLY

The present invention is a continuation-in-part of U.S. patent application for "Magnetron Sputter Gun Assembly with Distributed Magnetic Field," Ser. No. 7/740,436, filed Aug. 5, 1991, now U.S. Pat. No. 5,174,880, and a continuation-in-part of U.S. patent application for "Thin Film Medium with Layered Film Gradient," Ser. No. 07/837,855, filed Feb. 18, 1992, pending.

FIELD OF THE INVENTION

The present invention relates to a thin-film magnetic disc having a magnetic thin-film layer gradient in a radial direction, to a method for producing the disc, and to a sputtering target for use in practicing the method.

REFERENCES

Miller, M. S., et al., J. Applied Phys, 69 (8):4715 (1991).

Ranjan, R., et al., J. Applied Phys, 69 (8):4727 (1991).

Shiroishi, Y., et al., IEEE Transactions on Magnetics, 24 (6):2730 (1989).

White, R. (ed.), Introduction to Magnetic Recording, IEEE Press, N.Y. (1985).

Yogi, T., et al., IEEE Transactions on Magnetics, 26 (5):2271 (1990).

Yogi, T., et al., J. Applied. Phys, 69 (8):4749 (1991).

BACKGROUND OF THE INVENTION

Thin-film hard disc magnetic media are widely used for on-line data storage in computers. In recent years, considerable effort has been spent in achieving higher recording density. Among the most important factors in this recording density are:

(1) Magnetic remanence, which is a measure of the signal amplitude which can be read from an isolated pulse stored in the medium-the greater the remanence, or moment, the greater the signal amplitude which can be detected in a reading operation.

(2) Coercivity, defined as the magnetic field required to reduce the remanence magnetic flux to 0, i.e., the field required to erase a stored bit of information. Higher coercivity in a medium allows adjacent recorded bits to be placed more closely together without mutual cancellation. Thus, higher coercivity is associated with higher information storage density.

(3) Signal/noise ratio, defined as the ratio of the power of a given signal to the noise power in a given bandwidth, and provides a measure of signal amplitude relative to noise level. The higher the S/N ratio, the greater the bit density which can be read with a given degree of reliability.

(4) Overwrite, defined as the effectiveness in erasing a signal read at one frequency with a higher frequency signal. Overwrite provides a measure of the residual signal which remains after overwrite by a new signal.

(5) Flying height, i.e., the distance which a read/write head floats above the spinning disc. Less overlaps of voltage signals in adjacent magnetic domains in the disc occurs as the read/write head is moved closer to the disc surface, allowing recording density to be increased. The flying height is limited principally by surface irregularities in the disc. For a thin-film medium formed on standard aluminum substrate, the flying height is about 6 microinches. Flying heights as low as 1-2 microinches can be achieved in a thin-film medium formed on more perfect-surface substrate, such as a glass substrate.

In addition, it is now a common feature in hard disc systems to vary the read-write sampling frequency according to the radial position of the read-write head on the disc. In particular, the sampling frequency is increased, in progressing toward the outer-diameter region of the disc, to maintain a substantially constant linear bit density. Thus, for example, if the linear disc speed at the outer disc diameter is twice that at the inner diameter, the sampling frequency should also be twice as great at the outer diameter region to give the same linear density of bits at both inner- and outer-diameter regions. This greater sampling frequency results in a higher signal output and higher noise at the outer diameter of the disc.

At the same time, the overwrite characteristics in a thin-film medium tend to suffer at the outer diameter region of a thin-film medium. This is because of the higher recording frequency and because the head flying height, which depends on planing effects, increases with the greater disc linear velocity on moving toward the outer diameter region of the disc. Thus, a flying height of 6 micro-inches at the inner disc diameter can result in a 12 micro-inch flying height at the outer disc diameter. The greater flying height at the outer-diameter region, along with the higher recording frequency, reduces the ability of the head flux to saturate the magnetic domains in the magnetic layer, thus reducing overwrite characteristics.

In summary, radial-position effects due to differences in sampling rate and flying height at different radial positions on a disc can significantly effect the performance characteristics of the disc, particularity S/N ratio and overwrite, imposing different bit density limitations at both the inner- and outer-diameter regions of the disc.

It would therefore be desirable to provide a magnetic thin-film medium having a low signal-to-noise ratio at the inner diameter region of the medium, and good overwrite characteristics at the outer diameter region of the disc.

SUMMARY OF THE INVENTION

The invention includes, in one aspect, a target for use in a magnetron sputtering apparatus. The target has a annular base member, and inner and outer ring members disposed adjacent the base-member's inner and outer surfaces, respectively. The ring members have inner confronting surfaces which form, with the base-member target surface, an annular target surface having a channel-shaped cross section. At least one of the ring members is composed of a magnetic alloy having a selected metal composition which is different from that of the of base-member alloy.

The target is preferably designed for use in depositing a magnetic thin-film layer onto a substrate, in forming an annular magnetic thin-film recording disc characterized by a relatively high signal-to-noise ratio in an inner-diameter region of the disc, and a relatively high signal overwrite property in an outer-diameter region of the disc. Here the inner ring member and the base member are composed of Co-based magnetic alloys, and the base member has a higher atomic percentage of Pt and/or Ni than the inner ring member.

In another aspect, the invention includes a sputtering assembly for depositing a magnetic thin film on a substrate having inner-diameter and outer-diameter regions. The assembly includes a target of the type just described, ferromagnetic outer pole positioned adjacent the target's outer ring member, and having an outer extension which surrounds the target's outer ring member, and a ferromagnetic inner pole positioned adjacent the target's inner ring member, and having an outer extension which is surrounded by the target's inner outer ring member. The poles are designed to produce magnetic flux between the confronting walls of the target's inner and outer rings.

The target assembly may further include a shunt portion extending from one of the inner and outer poles toward the target opposite the base-member's target surface for conducting a portion of magnetic flux associated with the other of the inner and outer poles in a path extending through a portion of the target intermediate the inner and outer edges of the base member.

Also disclosed is a method of sputtering a magnetic thin film onto a substrate having inner and outer diameter regions. The method includes placing the disc directly over a target of the type described above, and sputtering material from the target onto the substrate under magnetic field conditions in which a magnetic flux between the confronting surfaces of said ring members is produced.

The method may be used, for example, in forming an annular magnetic thin-film recording disc characterized by a relatively high signal-to-noise ratio in an inner-diameter region of the disc, and a relatively high signal overwrite property in an outer-diameter region of the disc. The inner ring member and the base member in the target are composed of Co-based magnetic alloys, and the base member has a higher atomic percentage of Pt and/or Ni than the inner ring member.

These and other objects and features of the present invention will become more fully apparent when the following detailed description of the invention is read in conjunction with the accompanying drawings.

DETAILED DESCRIPTION OF THE PRESENT INVENTION

I. Target Assembly

Figure 1:
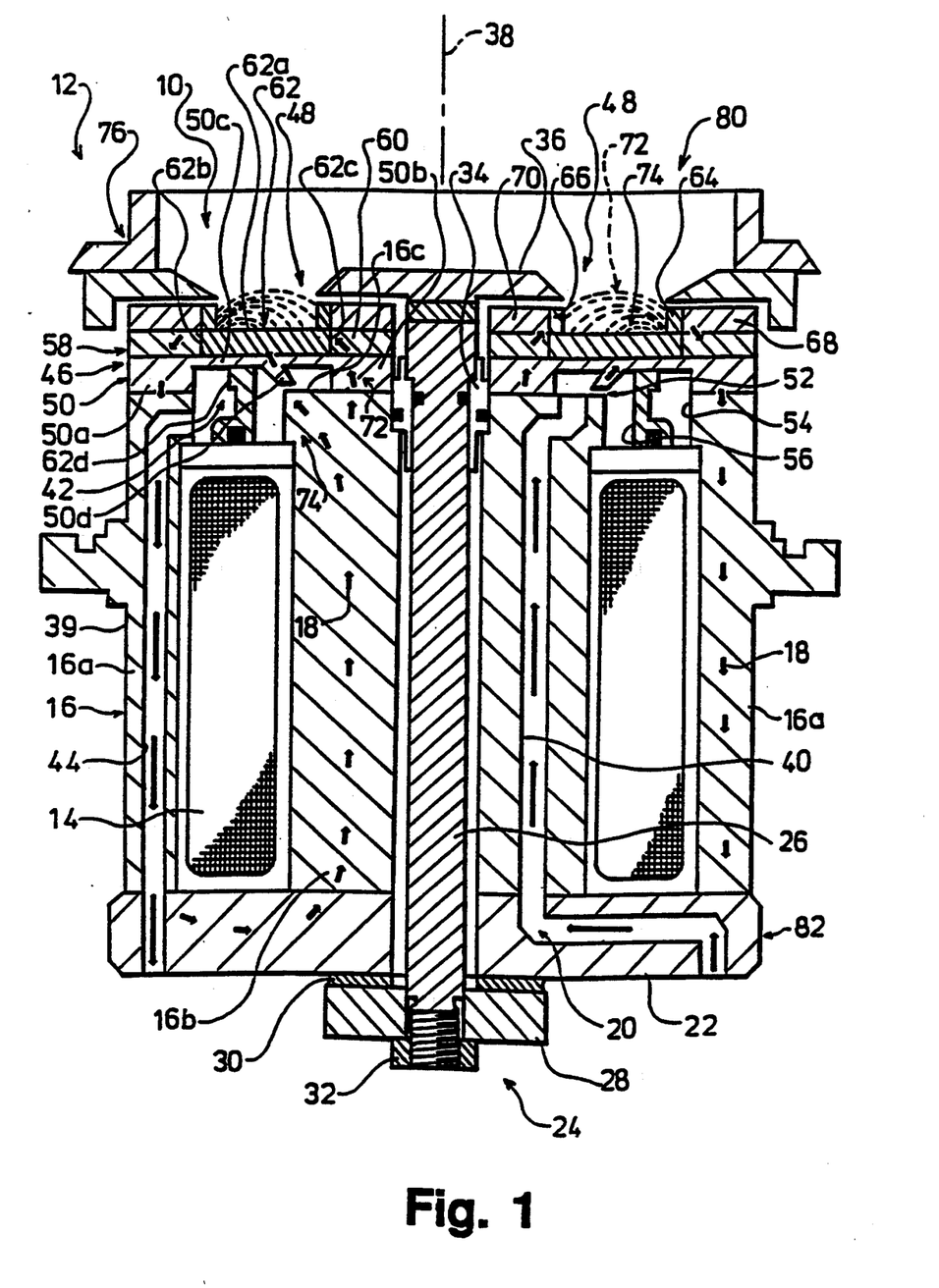
FIG. 1 is a cross section of a sputter assembly incorporating a sputtering target constructed according to the invention.

Referring initially to FIG. 1, a target assembly, shown generally at 10, forms part of an otherwise conventional sputter cathode assembly 12. Assembly 12 also includes an electromagnetic coil assembly 14 housed in a pole weldment 16 for conducting flux generally along a path 18 represented by the short dashed arrows, around the coil assembly, when the coil assembly is energized.

The cathode assembly is typically cooled by water traveling in a water channel 20. A rear pole 22 caps the pole weldment and is held in place by an anode assembly 24. Assembly 24 includes an anode post 26 secured with an anode cooler plate 28 and anode insulating washer 30 by a nut 32 threaded onto the end of the anode post, as shown.

An anode insulating seal 34 supports the opposite end of the anode post, which terminates in an exposed circular disk-shaped anode cap 36. The anode post and cap are symmetrical about the target center, represented by axis 38.

Pole weldment 16, driven by coil assembly 14 forms a source 39 of a magnetic field for use with target assembly 10. Magnetic flux of a first direction exists in the outer cylindrical portion 16a of the pole weldment, with the flux path completed by a corresponding smaller-diameter cylindrical inner portion 16b adjacent the anode post. The cathode assembly is cooled by water which travels in channel 20 through an inlet channel 40, around a target-cooling cavity 42 formed in target assembly 10 and pole weldment 16, as shown, and out an outlet channel 44.

The target assembly includes an outer pole means or assembly 46 and an inner pole means or assembly 48. The outer and inner pole assemblies are formed in part by an annular backing plate 50. The backing plate includes a thick circular outer pole portion 50a, a thick circular inner pole portion 50b, and a thin connecting intermediate portion 50c. From about the middle of the intermediate portion 50c and extending downward toward inner pole weldment portion 16b is an annular shunt portion 50d. The top end of pole weldment 16 is planar. The outer pole weldment portion 16a generally conforms to the size of outer pole portion 50a of the backing plate. However, the inner portion of the pole weldment extends outwardly away from axis 38 to a shoulder 16c. Shunt portion 50d extends inwardly toward shoulder 16c, but preferably does not quite touch it.

There is thus a nonferromagnetic portion or gap 52 filled with cooling water in operation. As is also shown, shunt portion 50d also narrows slightly in size toward the pole weldment shoulder. The gap and the shape and size of the shunt portion are used to control the amount of flux conducted through the shunt portion.

There also is an outer cavity 54 and an inner cavity 56, forming cooling cavity 42, of nonferromagnetic material, such as cooling water, between the shunt portion and the outer and inner portions of the backing plate. The forms of gap 52 and cavities 54 and 56 are also used to control the amount and location of flux flow between the inner portion of the pole weldment and the inner and shunt portions of the backing plate.

On top of outer portion 50a of the backing plate is an outer annular ferromagnetic ring spacer or clamp 58. A corresponding ferromagnetic ring spacer or clamp 60 is positioned on top of inner portion 50b of the backing plate. These clamps secure a circular base member 62 of a sputtering target 63 formed in accordance with another aspect of the invention. The base member has an upper (as shown in the figure) exposed, or sputtering, surface 62a, an outer annular surface 62b positioned against clamp 58, and inner annular surface 62c positioned against clamp and a base surface 62d supported on intermediate portion 50c of the backing plate.

Extending beyond the sputtering surface of the target base member is an outer annular ring 64 adjacent the outer annular surface of the base member, and an inner annular ring 66 adjacent the inner surface. As will be described below with respect to FIG. 2, base member 62, and inner and outer rings 66, 64, respectively, form a three-piece target 63 of the invention.

Rings 64 and 66 are held in place by an outer annular clamp 68 and an inner annular clamp 70, respectively. The outer pole assembly is thus formed of backing plate outer portion 50a, outer target clamp 58 and outer ring clamp 68. These components are formed of a suitable ferromagnetic material, such as 410 stainless steel, which is relatively opaque to magnetic flux lines from the magnetic poles in assembly.

The inner pole assembly provides for flux conduction along a first path 72 formed by backing-plate inner portion 50b, inner target clamp 60, and inner ring clamp 70, all also formed of a suitable ferromagnetic material, such as 410 stainless steel. The inner and outer ring clamps thus form extensions of the pole assemblies and the target rings 64 and 66 thereby define outer and inner target poles.

Flux conduction is also along a second path 74 formed by backing-plate shunt portion 50d and shunt gap 52. Clearly the distribution of flux across the surface of the target plate can readily be controlled as desired by appropriate selection of the size and magnetic-characteristic makeup of the shunt portion of the second flux path.

Figure 4A:
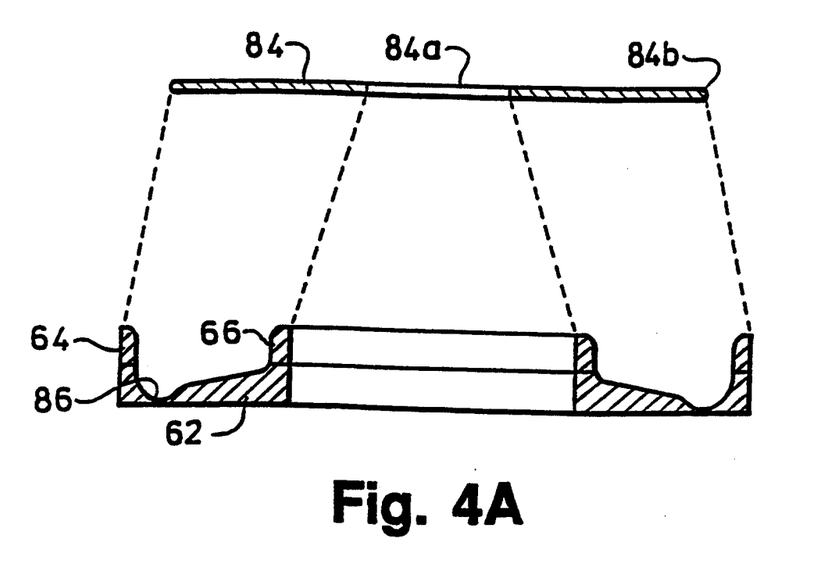
FIGS. 4A and 4B are cross sections of a target in the sputtering assembly of the present invention (4A), and in a conventional target assembly (4B), both near the end of target usage.

Finally, a conventional ground shield 76 extends circumferentially around the target assembly adjacent the outer ring clamps, as shown. The target assembly just described is contained within an enclosed chamber 80 in a sputtering apparatus, indicated generally at 82. Also carried in the chamber, and shown in FIG. 4A, is a disc substrate 84 which is positioned "above" the assembly for sputter deposition from the target, as described below. A similar target assembly may be positioned on the upper side of the substrate for sputtering a desired film onto the upper side of the substrate during a sputter operation. Each substrate, such as substrate 84, has an inner diameter edge 84a, and an outer diameter edge 84b, between which is the planar substrate surface on which material is deposited during sputtering. A typical substrate for a thin-film medium has an inner diameter of 25 mm, and an outer diameter of 95 mm.

II. Sputtering Target

Figure 2:
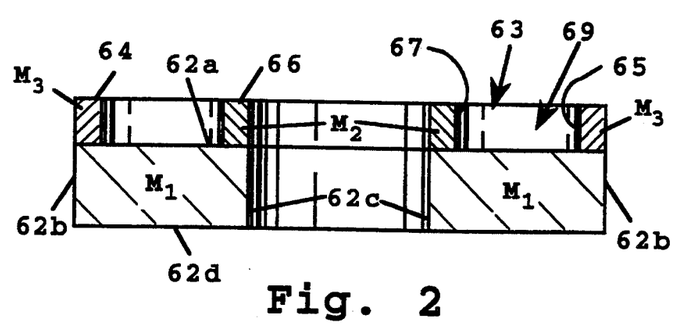
FIG. 2 is a cross-sectional view of a sputtering target formed in accordance with one embodiment of the invention.

FIG. 2 is a cross-sectional view of sputtering target 63 described above, and formed in accordance with the invention. As noted above, the target includes an annular base member 62 having a sputtering surface 62a, and inner and outer annular surfaces 62c, 62b, respectively. Disposed adjacent the base-member's inner and outer edges are inner and outer annular rings 66, 64, respectively.

The outer and inner rings have confronting annular surfaces 65, 67, respectively. These confronting surfaces form, with the exposed portion of sputtering surface 62a, an annular target surface 69 having a channel-shaped cross-section, as shown.

The composition of the target base member, and the inner and outer rings is indicated by $M_1$, $M_2$, and $M_3$, respectively, in FIG. 2. According to an important aspect of the invention, at least one of the ring members has a target composition which is different from that of the base member. In the most general embodiment, at least one of the compositions $M_2$ or $M_3$ is different from $M_1$. Typically, $M_1$ is one composition and $M_2$ and $M_3$ are each a second composition or a second and third composition.

Figure 3:
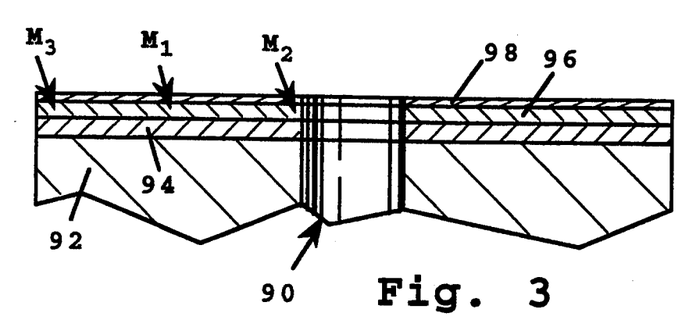
FIG. 3 shows a cross-sectional view of a thin-film magnetic medium formed by a sputtering assembly constructed in accordance with one embodiment of the invention.

Target compositions $M_1$, $M_2$, and $M_3$ can be selected to achieve a desired radial compositional gradient in one or more of the sputtered layers in a magnetic thin-film medium, such as medium 90 shown in cross section in FIG. 3. The medium shown here includes a disk-like substrate 92, an underlayer 94, and a magnetic thin-film layer 96 formed on the underlayer. The thin-film layer is protected by a carbon overcoat 98, which itself may be coated with a lubricant (not indicated).

FIG. 4A, which will be discussed further below, shows the relative positions of the sputtering target and a thin-film medium disc, here indicated at 84, in a sputtering operation. The inner- and outer-diameter regions are indicated at 84a, 84b, respectively. As seen, the inner and outer rings in the target are positioned to sputter material preferentially onto the inner- and outer-diameter regions of the disc, respectively, with the center region of the disc receiving sputtered deposition predominantly from the base member of the target. Thus, in designing the target, the composition $M_1$ is selected to provide "base" composition over the entire disc surface, and the composition $M_2$ and $M_3$ are selected to provide desired compositional gradients, with respect to the $M_1$ composition, at the inner- and outer-diameter regions of the disc, respectively.

In a preferred embodiment, the target is designed for sputtering the thin-film magnetic layer of a thin-film medium. Table 1 below shows the desired magnetization ($4\pi M_r$), overwrite, and noise properties in a thin-film magnetic layer, as discussed above. The outer-diameter region of the film, which will be influenced by target composition $M_3$, is preferably formed of a high magnetization/high noise alloy containing Ni and/or Pt, to achieve good overwrite and high signal amplitude at the outer-diameter region. The inner diameter region of the film, which will be influenced by target composition $M_2$, is preferably formed of a low magnetization/low noise alloy (lacking Ni and/or Pt), to achieve high signal-to-noise at the inner-diameter region. The "base" composition, provided by composition $M_1$, will preferably contain a composition which is intermediate between $M_2$ and $M_3$. Table 2 shows selected $4\pi m_r$ values for the three target compositions.

TABLE 1

| Type of Magnetic Media | | Magnetization ($4\pi Mr$) | Overwrite | Media Noise |
|---|---|---|---|---|
| CoNiCr, CoNiPt, CoNiPtX, CoNiPt, XY | } | $M_3$ Higher | Very Good | Higher |
| CoCrPt, CoCrPtTa | } | $M_3$ High | Good | High |
| CoCrTa | | $M_2$ Low | Poor | Low |
| New Compositional Gradient Media by using (3 Pcs.) | | High | Good | Low |

TABLE 2

Correlation Among Target Pieces, Magnetic Alloy Type and Magnetization Range

| Target Pieces | Magnetic-Alloy Type | Magnetic Moment | Range for Magnetization = $4\pi M_R$ (Gauss) |
|---|---|---|---|
| Main Target | $M_1$ | $\mu 1$ | 7600–10,000 |
| ID-Target Pole | $M_2$ | $\mu 2$ | 6000–7500 |
| OD-Target Pole | $M_3$ | $\mu 3$ | 10,100–13000 |

Table 3 below shows VSM-measured properties of three exemplary Co-based magnetic alloys suitable for forming a three-piece target of the type just described. The alloy compositions in the target, shown at the left in the table are: $M_1$=Co/Cr/Pt/Ta (80:10:7:3 atom percent), $M_2$=Co/Cr/Ta (84.5:12.5:3 atom percent), and $M_3$=Co/Cr/Pt/Ta/B (82:6:6:3:3 atom percent).

TABLE 3

Magnetic Properties of Different Magnetic Alloys

| | Magnetic Alloy Compositions | VSM Data | | | |
|---|---|---|---|---|---|
| | | Coercivity (Oe) | $4\pi M_R$ (Gauss) | SR | S* |
| TMM #17 | $Co_{84.5}Cr_{12.5}Ta_3$ | 1426 | 6010 | 0.78 | 0.71 |
| TMM #34 | $Co_{80}Cr_{10}Pt_7Ta_3$ | 1340 | 9145 | 0.90 | 0.86 |
| TMM #43 | $Co_{82}Cr_6Pt_6Ta_3B_3$ | 1623 | 9979 | 0.87 | 0.85 |

In a method of sputtering a magnetic thin film onto a substrate, a disc is placed directly over the three-piece target, as illustrated in FIG. 4A, and target material is sputtered from the target onto the disc. As indicated above, the sputtering method is effective to produce a compositional gradient, in a radial direction, on the surface of the disk. This gradient generally includes an $M_2/M_1$ gradient at the inner-diameter region of the disc, and an $M_1/M_3$ gradient at the outer-diameter region of the disc.

As an example of the method, a three-piece target having the following magnetic alloy compositions was prepared: $M_1$=Co/Cr/Pt/Ta/B (82:6:6:3:3 atom percent), and $M_2$=$M_3$=Co/Cr/Ta (84.5:12.5:3 atom percent). The target was used to prepare a magnetic thin film medium on a conventional coated aluminum substrate. The medium was prepared by first sputtering successively on the substrate (i) a 550 Å chromium underlayer, (ii) a 800 Å magnetic layer having a radial compositional gradient, as just described, and a 200 Å carbon overcoat.

As controls, magnetic thin-film media having a single-alloy thin-film layer were prepared with single-piece targets composed of either Co/Cr/Ta (84.5:12.5:3 atom percent) ($M_2$ and $M_3$) or Co/Cr/Pt/Ta (80:10:7:3). Dynamic magnetic properties of the three media are given in Table 4. From the data in this table, it is seen that the gradient-composition disc of the present invention has both high overwrite characteristics in the disc's OD region, and SNR values which indicate low noise at the inner-diameter region of the disc.

TABLE 4

ID to OD: OW and SNR for Old vs. new (3 Pcs.) Cathodes in Varian MDP-350

| Type of Magnetic Alloy | Type of Cathode | OD OW (−dB) | AC-SNR at | |
|---|---|---|---|---|
| | | | ID (dB) | OD (dB) |
| M1:$Co_{84.5}Cr_{12.5}Ta_3$ | Stnd. | 21 | 33.5 | 28.9 |
| M1:$Co_{80}Cr_{10}Pt_7Ta_3$ | Stnd. | 21.9 | 31.5 | 27.4 |
| M1:$Co_{82}Cr_6Pt_6Ta_3B_3$ M2:$Co_{84.5}Cr_{12.5}Ta_3$ M3:$Co_{84.5}Cr_{12.5}Ta_3$ | (3 Pcs.) | 24.8 | 31.5 | 29.2 |

The high OD overwrite characteristics of the gradient-composition medium reflect, in part, the greater film uniformity which can be achieved by the sputtering method involving a three-piece target, as described below.

III. Operating Characteristics

In operation, the chamber housing of the target assembly in the above sputtering device is evacuated, and an inert sputtering gas, such as argon, is introduced into the chamber to a final pressure of between about 2–20 mTorr typically. A voltage applied across the anode and cathode of the assembly produces electron collisions with the chamber gas which create positive ions formed between the two electrons. These ions, in the form of a sustained plasma, impact the target surface, ejecting target atoms which are then deposited on the confronting surface of the substrate.

As indicated above, the target assembly of the present invention functions to concentrate the magnetic field lines across the two poles, and indicated in FIG. 1 at 72 in the region formed immediately above target surface 62b, between the two target rings 64, 66. That is, the magnetic field lines are concentrated closer to the plane of the target surface, in directions more parallel to the target surface, than in a conventional target configurations, where the magnetic field lines are more arched and distant from the target surface.

This greater magnetic field concentration is due to two features of the invention. First, the raised ring-and-clamp structure, involving rings 64, 66 and the associated clamps 58, 60, acts to direct the magnetic field lines directly across the target surface, rather than normal to this surface, at the poles. Secondly, because the clamp structure in the assembly is relatively ferromagnetic (by virtue of its iron content in the present embodiment), the clamp acts as an extension of the magnetic poles, serving to divert the pole magnetic field lines (which are normal to the pole surfaces) between the raised clamps.

According to another feature of the invention, the magnetic-field shunt in the assembly creates, in effect, a split magnetic pole, the inner main pole of which acts to focus magnetic lines 72 across the entire target surface, between the raised target regions, and a secondary intermediate pole acting to drawing magnetic lines, such as indicated at 74 in FIG. 1, between the outer and center regions of the target surface. As a result, the plasma produced during sputtering is more evenly distributed across the target surface, with the advantages, in a sputtering operation, now to be described.

In the operations described below, sputtering was carried out using a Varian-MDP-350 (Intevac), Sputtering System (Santa Clara, Calif.), representative of a double-sided, single-disc, high-throughput machine having two interlocking systems, for loading and unloading. The cathode in the apparatus was modified according the present invention, as detailed in Section I. For comparative purposes, performance characteristics of the unmodified apparatus were also determined. In both cases, the sputtering chamber was evacuated to pressure of about $10^{-7}$ Torr, and argon gas was introduced into the chamber to a final sputtering pressure of up to 20 mTorr. The sputtering targets were cobalt alloy targets obtained from Hitachi Metals (Japan).

Figure 5:
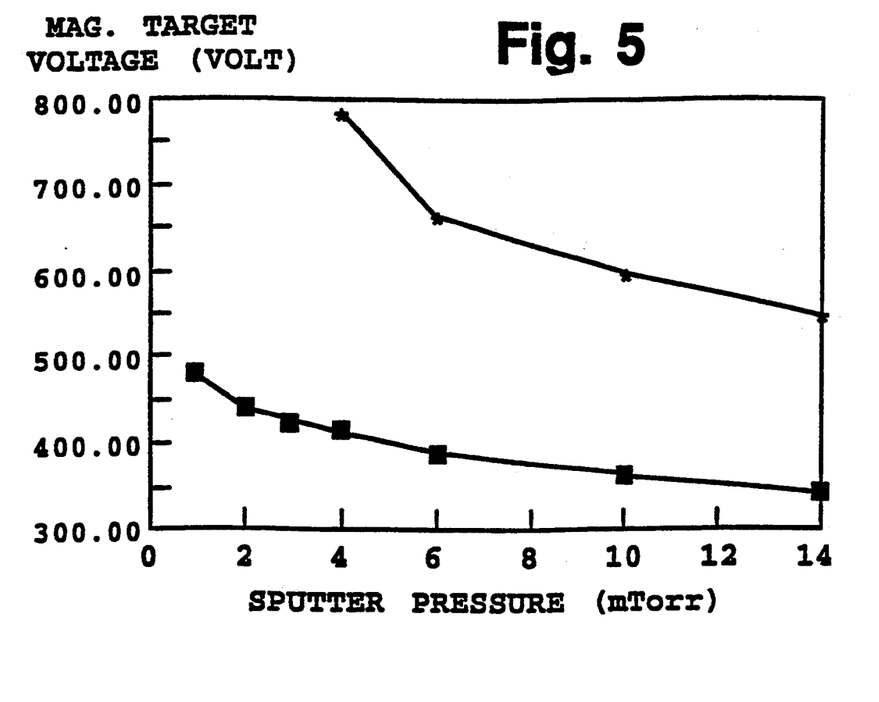
FIG. 5 shows plots of sputter pressure versus target voltage required for plasma ignition in the assembly of the present invention (solid rectangles) and in a conventional target assembly (crosses)

One measure of sputtering efficiency is the plasma voltage required to ignite the sputtering plasma, at a given chamber gas pressure. FIG. 5 shows plots of target voltage (in volts) versus argon pressure in the sputtering chamber at which plasma ignition is achieved. As seen, plasma ignition was achieved at an argon pressure as low as 1 mTorr, at a voltage of about 475 volts in the present invention (closed rectangles). At a pressure of 14 mTorr, the plasma ignition voltage was down to 350 volts. By contrast, plasma ignition in a conventional target. (crosses) was first seen at 4 mTorr, and only at maximum voltage (near 800 volts). Even at 14 mTorr, the plasma ignition voltage was still higher than 500 volts.

Figure 6:
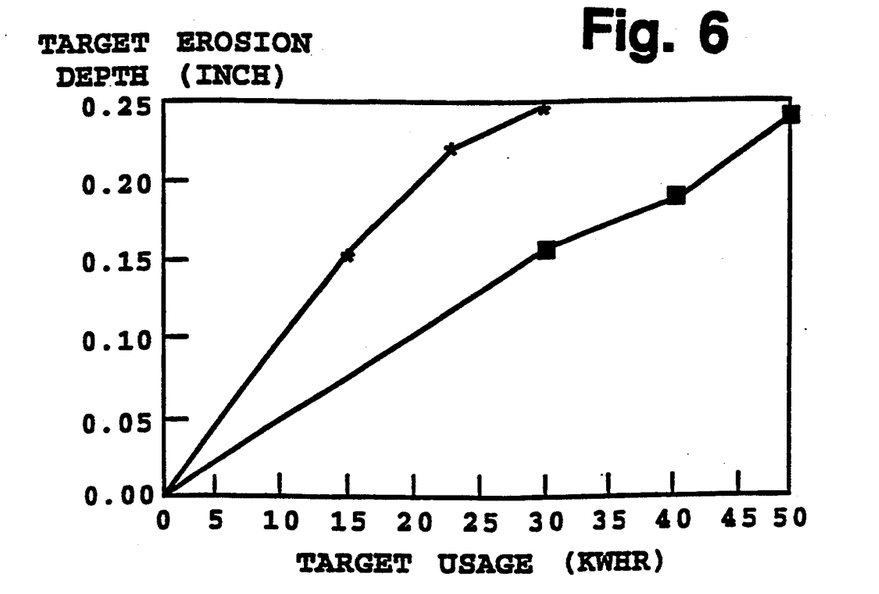
FIG. 6 is a plot of target erosion depth, as a function of target usage time, for a target in the sputtering assembly of the present invention (solid rectangles), and in a conventional target assembly (crosses)

Another important advantage of the present invention is greater target utilization, seen in FIGS. 4 and 6. FIG. 4A shows the cross-sectional profile of target 62 and target rings 64, 66 after about 50 kilowatt hours (KWH) of target use, and near the final stage of use. The profile shows erosion of material over the entire surface of the target, producing a shallow asymmetrical valley 86 which is centered near the outer region of the target. Some depletion of material is also seen in the raised ring portions of the target.

Figure 4B:
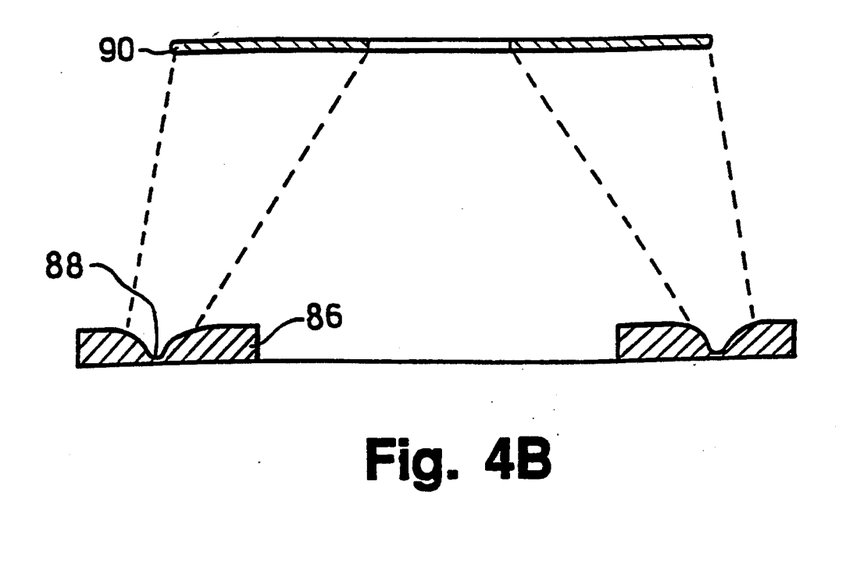

FIG. 4B shows the target profile after 30 KWH of use in a conventional target assembly. Here erosion of a target 86 is concentrated in a relatively narrow center region 88 of the target, forming a steep valley of eroded material, but leaving much of the target surface without any significant erosion.

FIG. 6 plots the erosion depth in a target, as a function of sputtering time (in KWH) for target erosion in a convention target assembly (crosses) and the assembly of the present invention. The total usage time of the target is increased from about 30 KWH in a conventional assembly to about 50 KWH in the present invention.

The broader area of target sputtering, and the shallower erosion profile achieved in the present invention also contributes to more uniform film-thickness deposition on a substrate surface. This feature can be appreciated from the sputtering diagrams in FIGS. 4A and 4B. In FIG. 4A, sputtered material (dotted lines) is shown being ejected across the entire target surface, including the raised target surface, onto the overhead portion of substrate 84. As indicated in the figure, this broad area of sputtered (ejected) target atoms material creates a relatively uniform deposition angle from the target across the entire substrate surface, i.e., between inner and outer edges 84a and 84b.

FIG. 4B illustrates the deposition of target material onto a substrate 90. As noted above, target deposition is confined to a relatively narrow ring in the target center region, and this produce a greater range of sputtering angle onto substrate 90 than in the present invention. Furthermore, as target erosion occurs, increasing sputtering occurs from the sides of the erosion valley, causing greater asymmetry (nonuniformity) in the sputtering angles directed against the target.

Figure 7:
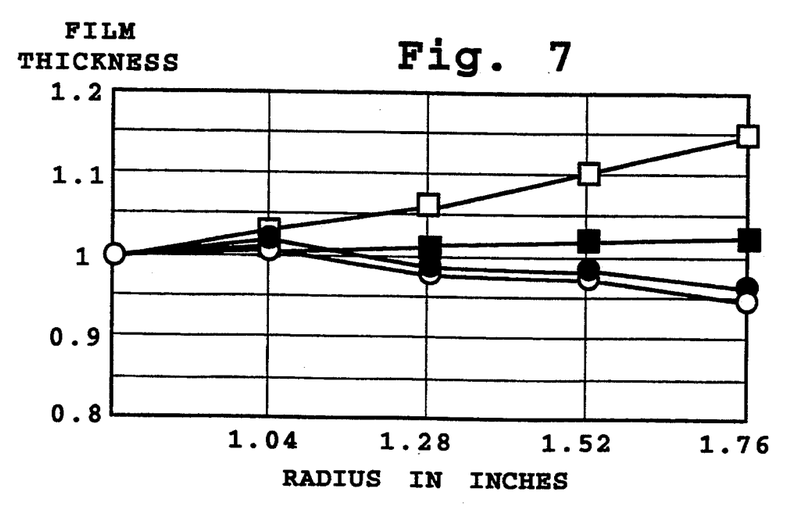
FIG. 7 shows plots of magnetic film thickness, from inner to outer-diameter regions of a magnetic disc, for films formed in the sputtering assembly of the present invention at early and late target usage times (solid triangles and open diamonds, respectively) and in a conventional sputtering assembly at early and late target usage times (solid rectangles and open rectangles, respectively).

FIG. 7 plots the variations in sputtered film thickness between inner and outer diameter regions of a substrate, under various sputtering conditions. The films indicated by solid rectangles and open squares were formed by a conventional sputter-target configuration, at 1.5 KWH and 25 KWH sputtering times, i.e., near the beginning and the end of a target lifetime, respectively. As the target is eroded, film thickness uniformity is compromised substantially. The films indicated by solid triangles and open diamonds, were produced at target times of about 1.5 and 48 KWH, respectively, in a sputtering cathode assembly constructed according to the present invention. At both target extremes, substantially uniform film thickness was achieved between inner and outer substrate edges.

From the foregoing, it will be appreciated how various objects and features of the invention are met. The assembly, by producing a selected, more uniform and more concentrated magnetic field pattern in the region of the sputtering target, increases target lifetime, and increases uniformity of sputtered film, over the life of a target. In addition, plasma ignition for sputtering occurs at lower pressures and voltages, increasing the pressure and voltage regions which can be varied in the sputtering process, for achieving desired film deposition rates and film properties.

It will be appreciated that various structural modifications may be made to achieve different selected erosion patterns and characteristics, by varying the size, shape, magnetic characteristics and position of the shunt portion of the inner pole assembly.

It will therefore be apparent to one skilled in the art that variations in form and detail may be made in the preferred embodiment without varying from the spirit and scope of the invention as defined in the claims. The preferred embodiment is thus provided for purposes of explanation and illustration, but not limitation.

Although the invention has been described with respect to particular embodiments, it will be apparent to those skilled in the art that various changes and modifications can be made without departing from the invention.

It is claimed:

1. A target assembly for use in a magnetron sputtering apparatus having a source of a magnetic flux comprising
    an annular sputtering target disposed around a central axis and having a sputtering surface extending transverse of the central axis, an inner surface proximal to the central axis, and an outer surface distal from the central axis, the sputtering surface extending between the inner and outer surfaces, said target having a selected composition;
    ferromagnetic outer pole means surrounding the target against the outer surface, having an outer extension extending beyond the target sputtering surface and defining an outer pole surface, and positioned for conducting magnetic flux corresponding to a first magnetic pole from the magnetic flux source;
    ferromagnetic inner pole means surrounded by the target against the inner surface, having an inner extension extending beyond the target sputtering surface and defining an inner pole surface, and being positioned for conducting magnetic flux corresponding to a second magnetic pole from the magnetix flux source;

the inner and outer pole means producing a flux path extending across the target between the confronting inner and outer pole surfaces;

inner and outer target rings disposed adjacent said inner and outer pole surfaces, respectively, at least one of said rings having a composition different from that of said target; and a shunt portion included in one of the inner and outer pole means extending toward the target opposite from the sputtering surface for conducting a portion of magnetic flux associated with one of the inner and outer pole means in a second flux path extending through a portion of the target intermediate the inner and outer surfaces to the extension of the other of the inner pole means and the outer pole means.

2. The target assembly of claim 1, for use in producing a thin-film medium having a magnetic thin-film layer with a compositional gradient between inner- and outer-diameter regions of the disc, wherein said target is composed of a Co-based alloy characterized by a relatively high magnetic remanence, and said inner ring is composed of a Co-based alloy characterized by a relatively low magnetic remanence.

3. The target assembly of claim 2, wherein said target and inner ring are Co/Cr/Ta alloys, and said target contains Pt and/or Ni.

4. The target assembly of claim 3, wherein said target is a Co/Cr/Ta/Pt/B alloy and said inner ring is a Co/Cr/Ta alloy.

5. The target assembly of claim 3, wherein said outer ring is composed of a Co/Cr/Ta alloy containing of Pt and/or Ni and characterized by a higher magnetic remanence than that of the target.

6. The target assembly of claim 3, wherein said outer ring is composed of a Co/Cr/Ta alloy characterized by a lower magnetic remanence than that of the target.

7. The target assembly of claim 6, wherein said target is a Co/Cr/Ta/Pt/B alloy and said inner ring and said outer ring alloy is a Co/Cr/Ta alloy.

8. The target assembly of claim 7, wherein the Co/Cr/Ta alloy contains between 70–90 atom percent Co, 5–20 atom percent Cr, and 2–7 atom percent Ta, and the Co/Cr/Ta/Pt/B alloy contains between 70–90 atom percent Co, 5–15 atom percent Cr, 2–7 atom percent Ta, 2–15 atom percent Pt, and 2–7 atom percent boron.

* * * * *